United States Patent
Yamada et al.

(10) Patent No.: US 6,368,756 B1
(45) Date of Patent: Apr. 9, 2002

(54) PHOTOMASK, METHOD FOR PRODUCING TFT SUBSTRATE, AND METHOD FOR PRODUCING DISPLAY DEVICE

(75) Inventors: Shigeyuki Yamada, Ise; Taimi Oketani, Matsuzaka; Yoshinori Shimada, Taki-gun, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/511,117

(22) Filed: Feb. 23, 2000

(30) Foreign Application Priority Data

Mar. 2, 1999 (JP) .......................................... 11-054805

(51) Int. Cl.⁷ .............................. G03F 1/88; G03F 9/30; G03C 1/136
(52) U.S. Cl. ...................... 430/5; 430/6; 430/7; 430/20; 438/149
(58) Field of Search ............................. 430/5, 4, 6, 20, 430/7; 216/23; 438/149; 349/50

(56) References Cited

FOREIGN PATENT DOCUMENTS

JP          5-326356 A        12/1993

Primary Examiner—Thorl Chea
(74) Attorney, Agent, or Firm—Nixon & Vanderhye P.C.

(57) ABSTRACT

A photomask of the present invention is a photomask for use in production of a display device, the photomask having on its surface a plurality of drawn areas and a transitional portion between two adjacent ones of the drawn areas. A pattern is formed on at least one of the drawn areas. A ratio between a pattern pitch and a transitional portion pitch is an integral ratio such that a length defined by a least common multiple of the pattern pitch and the transitional portion pitch is 1 mm or less.

12 Claims, 12 Drawing Sheets

PHOTOMASK, METHOD FOR PRODUCING TFT SUBSTRATE, AND METHOD FOR PRODUCING DISPLAY DEVICE

BACKGROUND OF THE INVENTION

1. Field of the Invention

The present invention relates to a photomask and, more particularly, to a photomask for use in the production of liquid crystal displays (LCDs) which are used as monitor displays in notebook computers, desk-top computers, car navigation systems, and in wall-hung TVs. The present invention also relates to a method for producing a TFT substrate and a display device using a photomask.

2. Description of the Related Art

In recent years, flat panel displays (FPDs) such as liquid crystal displays (LCDs) are widely used as display devices in personal computers or thin TVs. Efforts have been made in the art to increase the area of an FPD substrate in order to increase the area of these display devices. Accordingly, the area of a photomask used in the production of such an FPD substrate has also been increased.

In order to produce such a photomask having a large area, efforts have been made in the art to provide a mask drawer (drawing device) capable of high speed and large-area drawing operations. For example, Japanese Patent No. 2696364 and Japanese Laid-Open Publication No. 5-326356 disclose a type of a mask drawer, i.e., a raster scan type pattern drawing device. A conventional mask drawer capable of large-area drawing operations will now be described.

FIG. 1 illustrates a conventional mask drawer 100. The mask drawer 100 illustrated in FIG. 1 includes a pattern drawing laser light source 101, an acousto-optical modulator (AO modulator) 102 for changing the diffraction angle of a beam from the light source according to an input voltage, a zoom lens 103, an optical head 104, an optical head support guide 105 for allowing the optical head 104 to be moved along the "X" direction (as indicated in FIG. 1), an optical stage 107 on which a material sheet 106 is placed, and a mounting table 108 on which the optical stage 107 is mounted. The optical head 104 accommodates a polygon mirror which allows for a wide area exposure by repeatedly scanning the material sheet 106 with a beam, an objective lens for controlling a beam L1 to be incident upon the material sheet 106, etc. The optical stage 107 is mounted on the mounting table 108 so that the optical stage 107 is movable along the "Y" direction (as indicated in FIG. 1). In the mask drawer 100 illustrated in FIG. 1, the optical head 104 and the optical stage 107 are movable along the X direction and the Y direction, respectively. Alternatively, the optical head 104 may be fixed, with the optical stage 107 being movable along the X and Y direction. In any case, the optical head 104 can be positioned at an intended position above the material sheet 106.

Typically, the optical head 104 and the optical stage 107 are provided with laser length measuring devices 110 and 111, respectively. The length measuring devices 110 and 111 use a light beam L2 from a laser light source 109. Thus, it is possible to precisely position the optical head 104.

Next, a mask drawing method using the conventional mask drawer 100 will be briefly described.

First, the optical head 104 is positioned at an intended position above the material sheet 106 (e.g., the lower left corner of the material sheet 106).

The optical head 104 is then operated to scan the material sheet 106 with the beam L1, deflected by the AO modulator 102 by a predetermined interval along the Y direction. Moreover, the optical head 104 (or in some cases the optical stage 107) is moved along the X direction in synchronism with the rotation of the polygon mirror provided in the optical head 104. Thus, a strip-shaped portion 112 is drawn with a constant width $D_1$ along the Y direction. The width $D_1$ corresponds to the predetermined interval by which the optical head 104 is moved along the Y direction.

Then, the optical stage 107 is stepped by an appropriately adjusted drawing pitch of the mask drawer 100 which corresponds to the width $D_1$ of the drawn strip-shaped portion 112 along the Y direction. Thus, the optical head 104 is positioned at a position above the material sheet 106 adjacent to the previously drawn strip-shaped portion 112. Thereafter, by a process as described above, another strip-shaped portion having a predetermined width is drawn adjacent to the previously drawn strip-shaped portion 112. The above-described process is repeated in a raster scan manner so that a pattern is drawn across the entire surface of the material sheet 106.

Typically, the width $D_1$ of the strip-shaped portion 112 may be several tens to several thousands of micrometers. In the LCD field, for example, the range of the width $D_1$ suitable for practical use is several hundreds of micrometers. Minimizing the positional and dimensional errors in the laser-drawn areas (the strip-shaped portions) which are adjacent to one another is important for drawing an intended pattern across the entire surface of the material sheet 106. Various methods have been developed in the art to minimize the positional and dimensional errors in the laser-drawn areas. Two of such conventional methods will now be described.

The first conventional method is a multiple exposure method in which a sufficient overlap is provided between two adjacent exposed areas (laser-drawn areas). The first conventional method is performed by first exposing a first area with an amount of exposure which is equal to, for example, ¼ of the exposure sensitivity of a resist material used, then exposing a second area having the same size as the first area and displaced from the first area by ¼ of the area with the same amount of exposure (i.e., ¼ of the exposure sensitivity of the resist material), and so forth. In this method, a sufficient amount of overlap is provided for one exposed area (as a result, each area is exposed four times). In this way, although the positional and dimensional shift may possibly occur in each exposure step with the amount of ¼ of the exposure sensitivity of the resist material, for the whole process such a shift is compensated for. As a result, such a shift can be reduced. Therefore, it is possible to perform a drawing process with a very high positional and dimensional precision.

As described above, according to the first conventional method, a large amount of overlap is provided between two successive areas to be exposed, thereby considerably reducing the throughput of the mask production. Thus, this method has not been practical for large-area mask drawing process in terms of the cost. In fact, the application of this method has been limited to a process of drawing a relatively small-area pattern such as a mask used in a stepper (reticle).

The second conventional method is a drawing method for large-area masks in which the amount of overlap exposure provided for a transitional portion is minimized, thereby improving the production throughput.

The term "transitional portion" as used herein refers to an overlap, a gap or a boundary between two adjacent drawn areas (exposed areas) on the material sheet to be exposed.

The second conventional method will now be described.

FIG. 2 illustrates a portion of a photomask exposed according to the second conventional method around a transitional portion. Referring to FIG. 2, a first drawn area (first exposed area) 201 and an adjacent second drawn area (second exposed area) 202 overlap each other over a transitional portion 210.

According to the second conventional method, the amount of exposure for each area to be exposed is controlled in a graded manner (in a "stepped triangular pattern") with four different exposure levels (25%, 50%, 75% and 100%). In each transitional portion of two adjacent areas, a synthetic pattern obtained by synthesizing together the respective drawing patters is drawn. Thus, the transitional portion 210 is exposed to an amount of light which is determined according to a synthetic exposure profile 205 or 206 which is obtained by synthesizing together a first drawn area exposure profile 203 and a second drawn area exposure profile 204. The synthetic exposure profile 205 or 206 is ideally a straight line. However, when actual transition positions 208 and 209 are shifted from an intended transition position 207 by a minute positional shift amount ($\pm\Delta d$), the synthetic exposure profile 205 or 206 exhibits a rectangular protrusion corresponding to the minute positional shift amount ($\pm\Delta d$).

In the coordinate system illustrated in FIG. 2, when the minute positional shift amount in the second exposed area 202 has a positive value ($\Delta d$) (e.g., when the actual transition position is located at a position indicated by a broken line 208), an overexposure of 125% of the optimal exposure occurs locally as indicated by the synthetic exposure profile 205. Conversely, when the minute positional shift amount in the second exposed area 202 has a negative value ($-\Delta d$) (e.g., when the actual transition position is located at a position indicated by a broken line 209), an underexposure of 75% of the optimal exposure occurs locally as indicated by the synthetic exposure profile 206.

Thus, according to the second conventional method, it is possible to reduce the positional and dimensional error between two adjacent drawn areas while minimizing the amount of overlap in the transitional portion. This is because each transitional portion between two adjacent drawn areas is exposed to an amount of light which is obtained by averaging the respective amounts of exposure for the two areas (i.e., according to the synthetic exposure profile). Moreover, according to the second conventional method, the height or depth (amplitude) of the rectangular protrusion occurring in the synthetic exposure profile corresponding to the minute positional shift amount $\pm\Delta d$ is decreased.

However, there may still occur a shift in the amount of exposure corresponding to the above-described minute positional shift in the transitional portion or the error in the beam irradiation power (e.g., an area which is intended to be exposed with a 100% exposure may be exposed with a 98% exposure). Due to this problem, the second conventional method currently has a pattern drawing precision which is inevitably lower than that of the first conventional method by an order of magnitude. Moreover, FIG. 2 illustrates an example in which the exposure profile has an ideal stepped triangular pattern. In an actual process, however, there may be some variations in the deflected beam intensity which is controlled by the input voltage to the AO modulator. This may also disturb the drawn pattern. Moreover, it may be necessary to provide each transitional portion in the form of a strip-shaped area having a width of several tens of micrometers in order to avoid a substantial change in the positional and dimensional precision between two adjacent exposed areas.

Furthermore, the present inventors have found that the following problems may further occur when a mask used in an FPD substrate is drawn by using the second conventional method.

Where an FPD substrate is designed so that the strip-shaped transitional portion (drawing transitional portion) which is formed during the mask drawing process has a pitch having a relationship with that of the mask pattern at a particular cycle, the strip-shaped transitional portion on the mask may overlap the pattern formed on the FPD substrate. In such a case, a stripe pattern non-uniformity having a certain pitch may occur on the pattern on the FPD substrate. Such a pattern non-uniformity may be observed as a brightness non-uniformity on the display panel when a gray-scale image is displayed on the FPD in the form of a module.

Such a brightness non-uniformity is a phenomenon occurring due to a combination of two factors. The first factor is an optical diffraction due to a shift of about $\pm 0.1$ $\mu$m in the formed pattern, which may occur when the dimensional and positional precision in the mask transitional portion is not so high (about $\pm 0.1$ $\mu$m) and a remaining pattern on the substrate (e.g., the remaining pattern corresponds to a portion of the mask with a chrome film deposited thereon for a positive resist, and the remaining pattern corresponds to an opening of the mask for a negative resist) is provided on the transitional portion. The term "remaining pattern" as used herein refers to a portion of the resist that remains after being cured. Such an optical diffraction may be observed as a lightness/darkness non-uniformity on the display panel, thereby resulting in a display non-uniformity.

The second factor is the pitch of the brightness non-uniformity. For example, the visibility of the above-described lightness/darkness non-uniformity (brightness non-uniformity) substantially varies depending upon the pitch of the non-uniformity. For example, when the lightness/darkness non-uniformity has a pitch of about 2 mm or more, the lightness/darkness non-uniformity is observed as vertical and lateral stripes on the display panel. However, when the pitch is about 1 mm or less, the lightness/darkness non-uniformity is generally not observed. One factor which increases the pitch of a lightness/darkness non-uniformity is a relatively long pitch of the pattern non-uniformity which is determined based on the least common multiple of the pitch of the mask drawing transitional portions and the dot pitch of the display device. When the ratio between the transitional portion pitch and the dot pitch is 56:41, for example, a drawing transitional portion overlaps a mask pattern for every 56 dots of pixels of the display device. In such a case, if the dot pitch is 307.5 $\mu$m, for example, a lightness/darkness non-uniformity having a cycle of 17.22 mm occurs. The lightness/darkness non-uniformity having such a long cycle has a very high visibility, and may easily be observed as a display non-uniformity on the display panel.

Such a display non-uniformity due to a positional and dimensional error of a mask pattern may be avoided if the mask pattern precision can be improved. However, it has been confirmed that the deflection angle of an acousto-optical modulator may vary due to a change in the temperature, and it is well known in the art that the pattern precision may be affected by even a slight inclination of the rotational axis of the polygon mirror or a rotational non-uniformity of the polygon mirror. Therefore, it is difficult in practice to further improve the pattern precision. Other than those described above, there are still other factors which decrease the pattern precision. For example, although the scanning and stepping precision of the optical stage and the optical head is provided by using a laser length measuring devices, the positional precision of the laser length measuring device may not always be synchronized with the optical system for producing the drawing beam. It is believed that the positional precision of the laser length measuring device has at least some variation. Moreover, in order to improve the pattern precision, it is necessary to keep constant the stage stepping interval. Therefore, each element of the stage driving system, e.g., a ball screw or a linear motor, is required to have a very high precision.

As described above, improving the mask pattern precision itself is very important and effective in order to obtain a display device having a high quality, but also is very complicated and difficult. Improving the mask pattern precision may require, for example, a very costly correction mechanism provided in the drawing device. As a result, it becomes very time-consuming and costly to obtain a high-precision mask, which will be reflected upon the cost of a product which is produced by using the mask.

SUMMARY OF THE INVENTION

According to one aspect of this invention, there is provided a photomask for use in production of a display device, the photomask having on its surface a plurality of drawn areas and a transitional portion between two adjacent ones of the drawn areas. A pattern is formed on at least one of the drawn areas. A ratio between a pattern pitch and a transitional portion pitch is an integral ratio such that a length defined by a least common multiple of the pattern pitch and the transitional portion pitch is 1 mm or less.

In one embodiment of the invention, the ratio between the pattern pitch and the transitional portion pitch is 1:1.

In one embodiment of the invention, the ratio between the pattern pitch and the transitional portion pitch is 3:4, 2:3, 1:2, 1:3 or 1:4.

In one embodiment of the invention, the pattern and the transitional portion do not substantially overlap each other.

In one embodiment of the invention, the pattern pitch corresponds to a dot pitch of the display device.

In one embodiment of the invention, the transitional portion pitch is determined by controlling a scanning width of a head of a mask drawer for drawing the photomask and a pitch with which a stage of the mask drawer is moved.

In one embodiment of the invention, the pattern is a signal line.

In one embodiment of the invention, a pattern drawing operation is performed by a raster scan method.

According to another aspect of this invention, there is provided a method for producing a TFT substrate. The method includes the steps of: forming a gate bus line on a substrate; forming a semiconductor layer on the substrate; forming a source bus line so that the source bus line crosses the gate bus line and is electrically connected to the semiconductor layer; and forming a pixel electrode so that the pixel electrode is electrically connected to the semiconductor layer. At least one of the gate bus line, the source bus line, the semiconductor layer and the pixel electrode is formed by using a photomask. The photomask has on its surface a plurality of drawn areas and a transitional portion between two adjacent ones of the drawn areas. A pattern is formed on at least one of the drawn areas. A ratio between a pattern pitch and a transitional portion pitch is an integral ratio such that a length defined by a least common multiple of the pattern pitch and the transitional portion pitch is 1 mm or less.

According to still another aspect of this invention, there is provided a method for producing a display device. The method includes the steps of: forming a TFT including a gate bus line, a source bus line, a semiconductor layer and a pixel electrode on a first substrate; forming a counter electrode on a surface of a counter substrate which faces the first substrate; and providing a display medium layer between the first substrate and the counter substrate. The step of forming the TFT includes the step of forming at least one of the gate bus line, the source bus line, the semiconductor layer and the pixel electrode by using a photomask. The photomask has on its surface a plurality of drawn areas and a transitional portion between two adjacent ones of the drawn areas. A pattern is formed on at least one of the drawn areas. A ratio between a pattern pitch and a transitional portion pitch is an integral ratio such that a length defined by a least common multiple of the pattern pitch and the transitional portion pitch is 1 mm or less.

In one embodiment of the invention, the display device further includes a color filter, and the color filter is formed by using the photomask.

According to still another aspect of this invention, there is provided a method for producing a display device. The method includes the steps of: forming, on a first substrate, a plurality of first signal lines extending in a stripe pattern along a first direction; forming, on a second substrate which opposes the first substrate, a plurality of second signal lines extending in a stripe pattern along a direction different from the first direction; and providing a display medium layer between the first substrate and the second substrate. At least one of the step of forming the first signal lines and the step of forming the second signal lines uses a photomask. The photomask has on its surface a plurality of drawn areas and a transitional portion between two adjacent ones of the drawn areas. A pattern is formed on at least one of the drawn areas. A ratio between a pattern pitch and a transitional portion pitch is an integral ratio such that a length defined by a least common multiple of the pattern pitch and the transitional portion pitch is 1 mm or less.

The function of the present invention will now be described.

In the photomask of the present invention, the pattern pitch and the transitional portion pitch have a integral ratio such that the least common multiple thereof is 1 mm or less. Therefore, a mask pattern non-uniformity in a transitional portion, if any, always occurs with a cycle of 1 mm or less. When using such a photomask which may have a pattern non-uniformity with a relatively short pitch, the produced pattern (e.g., a gate line pattern, a source line pattern, or an insulator pattern) on the substrate may also have a pattern non-uniformity with a relatively short pitch. If a pattern is formed on a TFT substrate by using such a photomask and the TFT substrate is used in a display device, even when the pattern non-uniformity acts as a diffraction grating, there will be no brightness non-uniformity which can be observed on the display panel by an observer because the pitch of the pattern non-uniformity is short.

Moreover, when the ratio between the pattern pitch and the transitional portion pitch is set to 1:1, it is possible to suppress the occurrence of a periodic pattern non-uniformity even if there is a positional shift of the pattern in the transitional portion. A pattern formed on a substrate using such a photomask does not have a periodic pattern non-uniformity. Therefore, when such a substrate is used in a display device, it is possible to better suppress the occurrence of the brightness non-uniformity, or the like.

Furthermore, when the ratio between the pattern pitch and the transitional portion pitch is set to 3:4, 2:3, 1:2, 1:3 or 1:4, the transitional portion will have an increased pitch, whereby it is possible to increase the size of each area to be drawn. Therefore, it is possible to increase the drawing pitch by which the drawer draws a mask, whereby it is possible to reduce the mask production time.

By preventing a pattern and a transitional portion from substantially overlapping each other, it is possible to suppress the occurrence of the positional and dimensional shift of the pattern in the transitional portion.

Thus, the invention described herein makes possible the advantages of: (1) providing a photomask for use in the production of a large-screen display device with which it is possible to reduce the occurrence of the display non-uniformity in the produced display device without improving the positional and dimensional precision of the mask pattern; and (2) providing a method for producing a TFT substrate and a display device using such a photomask.

These and other advantages of the present invention will become apparent to those skilled in the art upon reading and understanding the following detailed description with reference to the accompanying figures.

DESCRIPTION OF THE PREFERRED EMBODIMENTS

A photomask according to an embodiment of the present invention will now be described. In the following embodiment, a photomask used for forming a gate bus line on an FPD substrate will be described.

Figure 3:
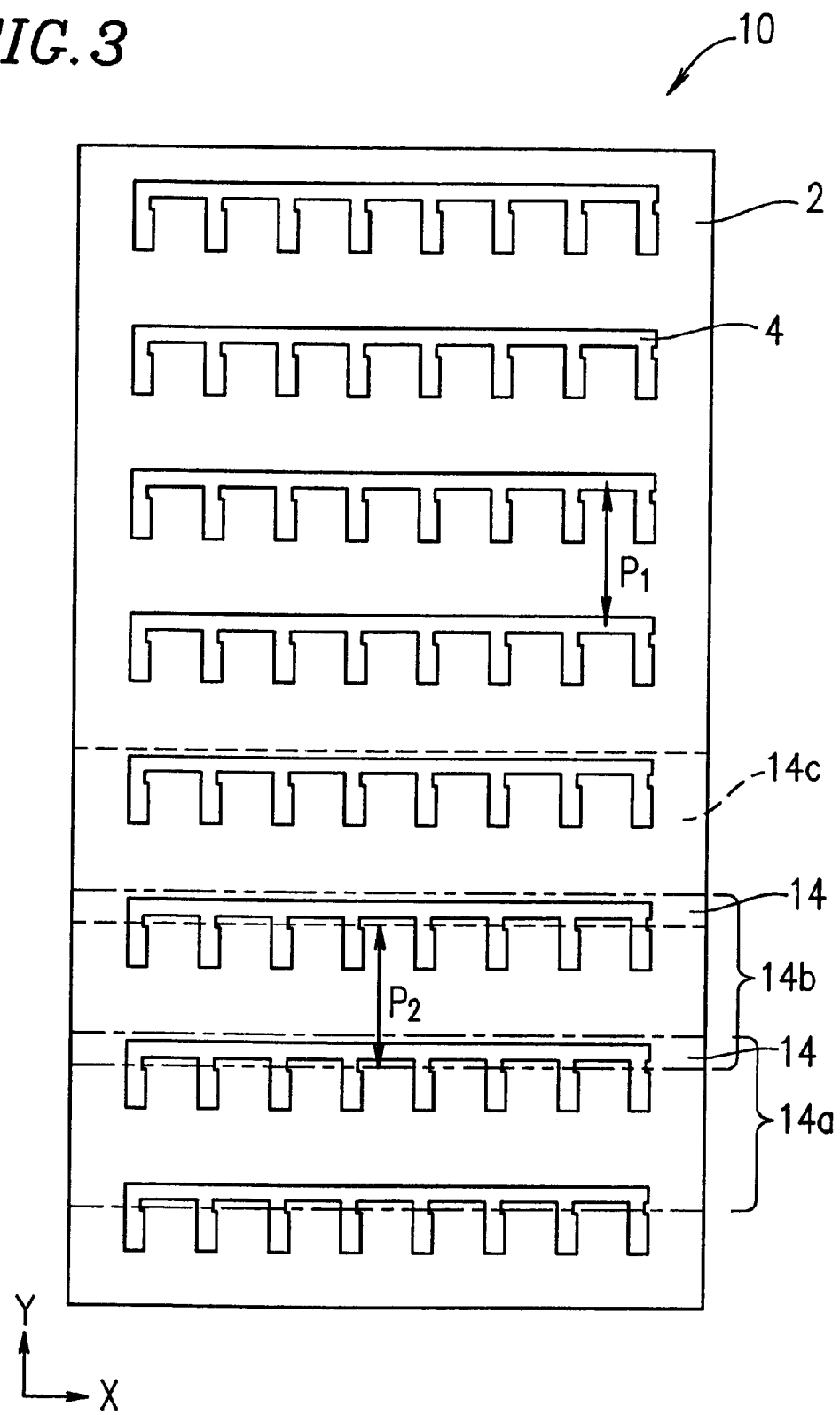
FIG. 3 illustrates a photomask of the present invention.

FIG. 3 illustrates a photomask 10 according to this embodiment of the present invention. The photomask 10 may have a size (vertical×lateral) of 620 mm×720 mm, 390 mm×610 mm, 500 mm×750 mm, etc., so as to accommodate large-screen FPDs.

The photomask 10 has a continuous pattern 4 for forming a gate bus line on a photomask substrate 2. The shape of the continuous pattern 4 is the same as the shape of the gate bus line to be formed. The pitch $P_1$ of the continuous pattern 4 corresponds to the pixel size of the FPD to be produced.

A transitional portion 14 is defined on the surface of the photomask 10. The transitional portion 14 is an area where a first drawn area 14a, i.e., a predetermined area which is drawn by a mask drawer (exposed area), and a second drawn area 14b which is drawn to overlap the first drawn area 14a. As described above, in the transitional portion 14, the pattern precision may decrease due to the difference between the positional and dimensional precision in the first drawn area 14a and that in the second drawn area 14b.

As can be seen from FIG. 3, the transitional portion 14 is similarly formed between the second drawn area 14b and a third drawn area 14c.

In this embodiment of the present invention, the pitch $P_2$ of the transitional portion 14 is selected so that the ratio between the pattern pitch $P_1$ and the pitch $P_2$ of the transitional portion 14 is a simple integral ratio. As illustrated in FIG. 3, the ratio between the pitch $P_1$ and the pitch $P_2$ is 1:1 in a preferred embodiment of the present invention.

The selection of the ratio between the pitch $P_1$ and the pitch $P_2$ will now be described.

In this embodiment, the pattern pitch $P_1$ is the same as the dot pitch of the FPD, and the pitch $P_2$ of the transitional portion 14 is the same as the width by which the drawer steps after drawing a predetermined area (i.e., the drawing pitch). Therefore, selecting the ratio between the pitch $P_1$ and the pitch $P_2$ is equivalent to selecting the ratio between the dot pitch of the FPD and the drawing pitch of the drawer. In this embodiment, the ratio between the dot pitch of the FPD and the drawing pitch of the drawer is selected to be a simple integral ratio, so as to prevent the occurrence of a pattern non-uniformity on the FPD substrate or to prevent the brightness non-uniformity (lightness/darkness non-uniformity) from being observed on the display panel by an observer, even if there occurs a pattern non-uniformity, by setting the pitch of the pattern non-uniformity to be relatively short.

The pattern non-uniformity on the FPD substrate may occur with a pitch which is equal to the least common multiple of the dot pitch of the FPD and the drawing pitch of the drawer. This is because a pattern non-uniformity according to a positional error of about ±0.1 μm occurs only when the mask pattern pitch $P_1$ and the pitch $P_2$ of the transitional portion 14 overlap each other. As described above, if the pitch of the pattern non-uniformity is about 1 mm or less, no lightness/darkness non-uniformity is observed by a human observer. In view of this, the ratio between the dot pitch and the drawing pitch is determined as follows.

Where the ratio of dot pitch:drawing pitch is x/y, the condition under which the least common multiple of the two pitches is 1 mm or less is represented by Expression 1 below. (Expression 1)

$$Dp \cdot y \leq 1$$

In Expression 1, Dp is an actual dot pitch (mm). In view of production throughput, Dp is normally set to a value such that x≦y. Under such a condition, (x, y) which satisfies Expression 1 may be (1, 1), (3, 4), (2, 3), (1, 2), (1, 3) or (1, 4) when Dp≦250 μm, and (1, 1), (2, 3), (1, 2) or (1, 3) when Dp>250 μm. Dot pitches typically employed in an LCD device are shown in Table 1 below.

TABLE 1

Exemplary dot pitches for LCD devices

| Panel size | Number of pixels | Gate bus line pitch (μm) | Source bus line pitch (μm) |
|---|---|---|---|
| 12.1" | 800 × 600 | 307.5 | 102.5 |
| 12.1" | 1024 × 768 | 240 | 80 |
| 13.3" | 1024 × 768 | 264 | 88 |
| 14.1" | 1024 × 768 | 280 | 93 |
| 15" | 1024 × 768 | 297 | 99 |

Thus, for example, by setting the dot pitch of the FPD (i.e., the pattern pitch) to be equal to the drawing pitch (i.e., the transitional portion pitch) (so that the ratio thereof is 1:1), all the gate bus lines are formed with a positional and dimensional error of ±0.1 μm. Therefore, the occurrence of the periodic pattern non-uniformity is suppressed and the brightness non-uniformity can be theoretically eliminated. Moreover, also by setting the ratio between the dot pitch of the FPD and the drawing pitch to a simple integral ratio such as 2:3 or 1:2, the pattern non-uniformity will have a very fine pitch (about 1 mm or less), whereby the brightness non-uniformity occurring on the display panel due to the pattern non-uniformity will be on the level such that it cannot be visually perceived by a human observer.

In the above description, an example has been illustrated in which the drawing start point of the drawer is adjusted so that the gate bus line pattern and the transitional portion periodically overlap each other on the mask. Alternatively, the drawing start point may be shifted so that the gate bus line pattern, which is a remaining pattern, and the transitional portion do not overlap each other. In such a case, it is possible to eliminate the disturbance of the gate bus line pattern in the transitional portion, thereby further improving the non-uniformity suppressing effect.

Figure 1:
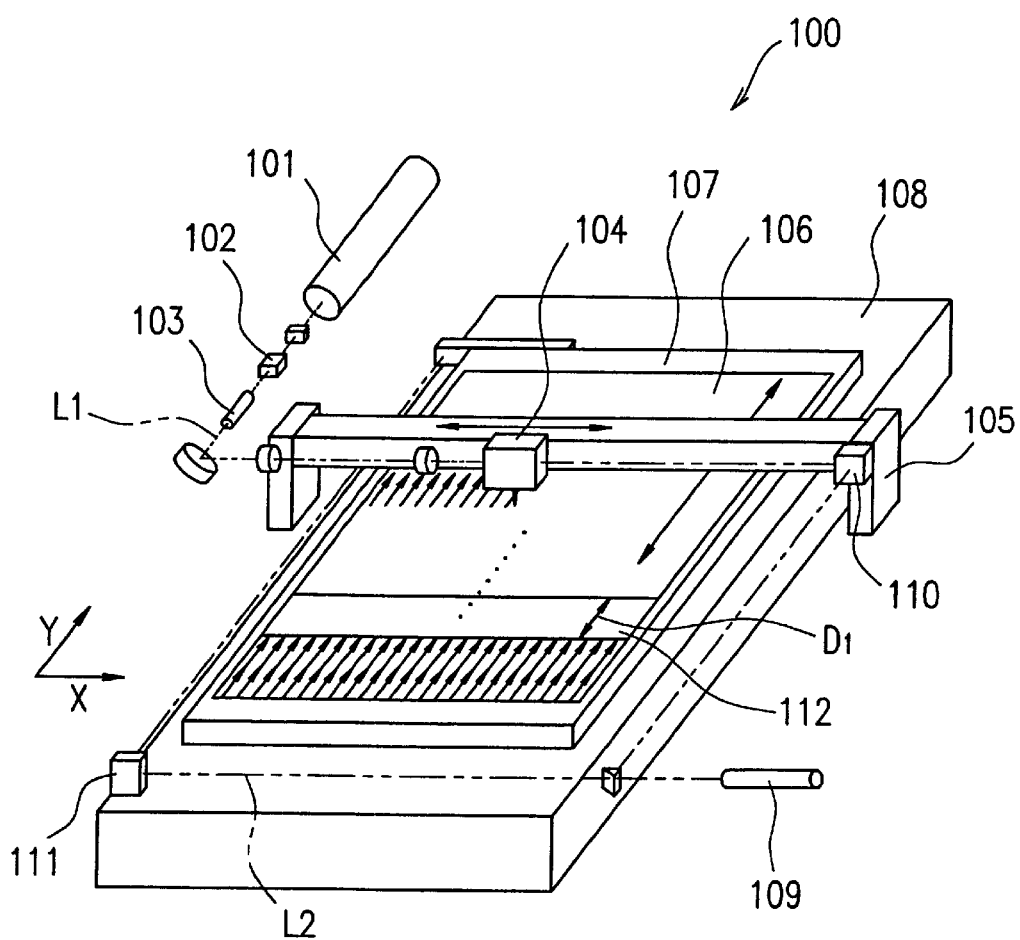
FIG. 1 illustrates a conventional mask drawer.

The photomask of this embodiment can be produced by using, for example, the conventional mask drawer 100 illustrated in FIG. 1. A method for producing the photomask of this embodiment will now be described.

The photomask substrate 2 is placed on the optical stage 107 of the mask drawer 100 illustrated in FIG. 1 as the material sheet 106. The photomask substrate 2 may be a substrate made of a composite quartz having a thickness of, for example, 5–10 mm.

The photomask substrate 2 is scanned by a predetermined interval along the Y direction and along the X direction with a deflected beam from the optical head 104 (e.g., with a beam diameter on the order of 0.1 μm–10 μm, and a beam intensity of several tens of mJ/cm$^2$). Thus, an intended pattern is drawn in the first drawn area 14a having a width of, for example, 420 μm along the Y direction.

Then, the optical head 104 is moved relative to the photomask substrate 2 and positioned at a predetermined position, after which the second drawn area 14b is drawn adjacent to the first drawn area 14a. In this process, the transitional portion 14 is formed between the first drawn area 14a and the second drawn area 14b. In this embodiment, the transitional portion 14 is an area where the first drawn area 14a overlaps second drawn area 14b.

The drawing pitch can be controlled by, for example, variably controlling the laser scanning length. In such a case, however, if the maximum laser scanning length is increased, the pattern precision may be reduced. Therefore, it may be desirable in order to maintain a good precision to fix the maximum scanning length (on the order of millimeters) so that the scanning length is variable over a range defined by the fixed maximum scanning length. In any case, the drawing pitch (transitional portion pitch) can be controlled by controlling the scanning width of the head of the mask drawer 100 and the stage moving pitch.

Thereafter, the third drawn area 14c is further drawn by a process similar to that described above. By further repeating the process, the entire surface of the material sheet 106 is patterned.

Thus, the photomask of the present invention is produced on an assumption that it is very difficult to improve the pattern precision. Therefore, the production of the photomask of the present invention does not require a further improved precision for the beam positioning and for the power of the drawer.

The photomask of the present invention will be described in greater detail.

Figure 4A:
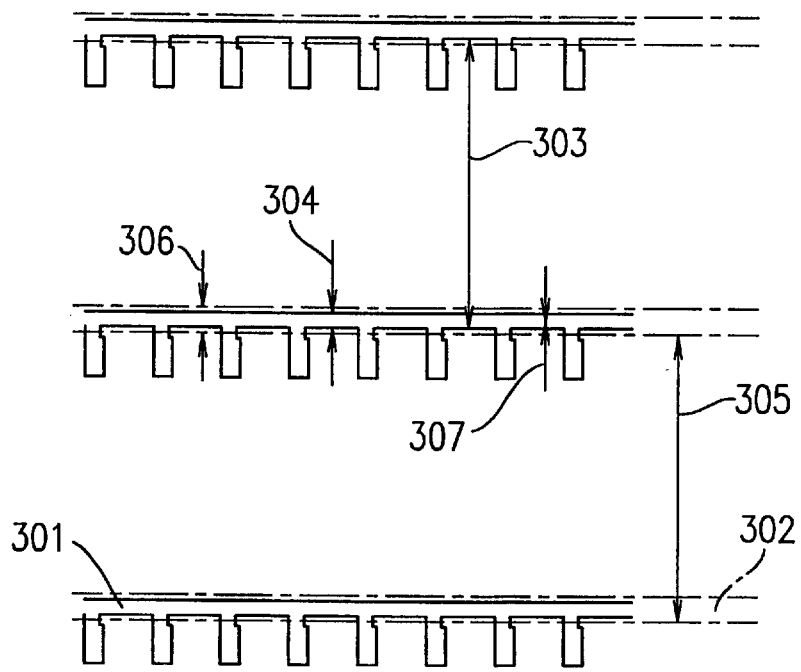
FIG. 4A illustrates a pattern pitch and a transitional portion pitch when dot pitch:drawing pitch=1:1.
Figure 4B:
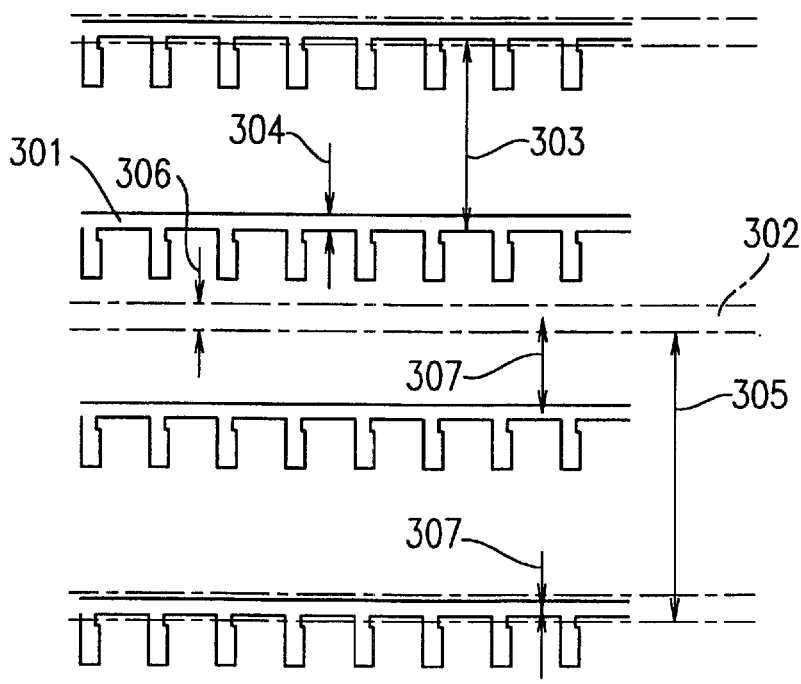
FIG. 4B illustrates a pattern pitch and a transitional portion pitch when dot pitch:drawing pitch=2:3.
Figure 4C:
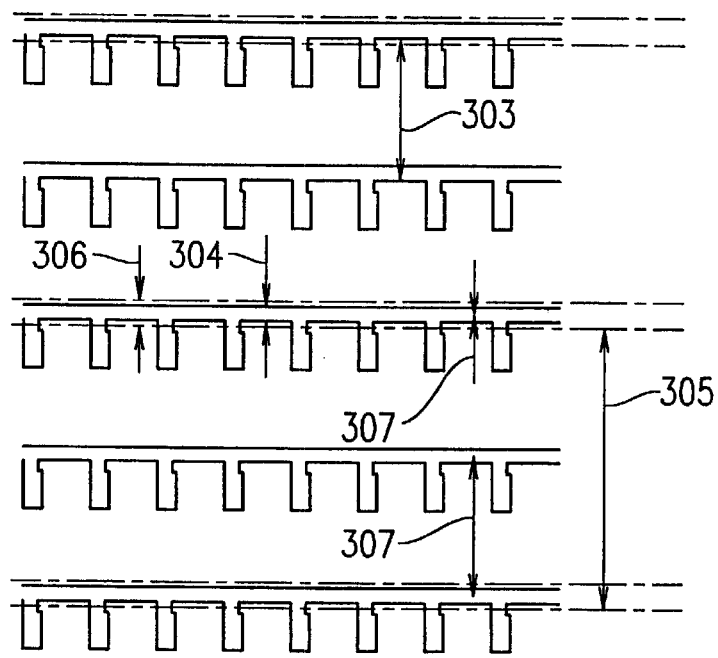
FIG. 4C illustrates a pattern pitch and a transitional portion pitch when dot pitch:drawing pitch=1:2.

FIGS. 4A, 4B and 4C each illustrate an enlarged view of a photomask which is produced while setting the ratio between the bus line pitch (dot pitch) and the transitional portion pitch (drawing pitch) to an integral ratio, i.e., 1:1, 2:3 and 1:2, respectively. According to the embodiment to be described below, a photomask for forming a gate bus line was produced. In the production of the photomask, the scanning length by which the drawing head (optical head) is moved along the Y direction for each scanning step was fixed at 453 μm.

The photomasks Illustrated In FIGS. 4A to 4C have gate bus line pitches 303 of 420 μm, 280 μm and 210 μm, respectively, and a bus line width 304 of about 21.5 μm, a transitional portion pitch 305 of 420 μm, and a transitional portion width 306 of 33 μm.

Figure 4D:
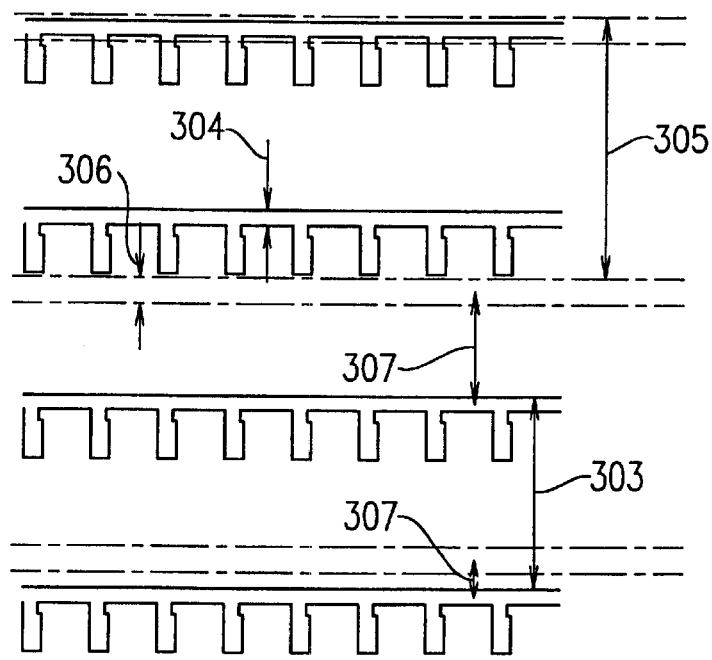
FIG. 4D illustrates a pattern pitch and a transitional portion pitch when dot pitch:drawing pitch=41:56.

As illustrated in FIG. 4D, as a conventional example, another mask (having a gate bus line pitch of 307.5 μm and a transitional portion pitch of 420 μm) was produced while setting the ratio between the bus line pitch (dot pitch) and the transitional portion pitch (drawing pitch) to 41:56, and was compared with the masks illustrated in FIGS. 4A to 4C.

FPD was produced by using each of these masks. Lightness/darkness non-uniformity was not observed for an FPD produced by using a maks illustrated in FIG. 4A to 4C (dot pitch:drawing pitch=1:1, 2:3, and 1:2). A periodical lightness/darkness non-uniformity having a cycle of 17.22 mm was observed for the FPD produced by using the coventional mask (dot pitch:drawing pitch=41:56). The results are shown in Table 2 below.

TABLE 2

Non-uniformity for different masks

| | Gate bus line pitch (μm) | Transitional portion pitch (μm) | Pitch ratio | Lightness/darkness non-uniformity | FIG. |
|---|---|---|---|---|---|
| Example | 420 | 420 | 1:1 | Non-uniformity not observed | 4A |
| Example | 280 | 420 | 2:3 | Non-uniformity not observed | 4B |
| Example | 210 | 420 | 1:2 | Non-uniformity not observed | 4C |

TABLE 2-continued

Non-uniformity for different masks

| | Gate bus line pitch (μm) | Transitional portion pitch (μm) | Pitch ratio | Lightness/darkness non-uniformity | FIG. |
|---|---|---|---|---|---|
| Prior Art | 307.5 | 420 | 41:56 | Long cycle of 17.22 mm For each cycle several lines of non-uniformity appeared with a pitch of about 4.6 mm | 4D |

The mechanism of the ocurrence of the pattern non-uniformity when using the mask where dot pitch:drawing pitch=41:56 is represented by the distance between a gate bus line and a transitional portion closest to the bus line. Each of FIGS. 4A to 4D illustrates a distance 307 between a gate bus line and its closest transitional portion. The distance 307 as used herein is defined between the center line of the bus line extending along its longitudinal direction and the center line of the transitional portion extending along its longitudinal direction.

Alternative examples where the gate bus line pitch is 307.5 μm, and the transitional portion pitch is 307.5 μm (dot pitch:drawing pitch=1:1), 461.25 μm (dot pitch:drawing pitch=2:3) and 615 μm (dot pitch:drawing pitch=1:2), respectively, will now be described. In these examples, the ratios between the dot pitch and the drawing pitch are the same as those in the examples illustrated in FIGS. 4A to 4C, respectively.

An observation of the masks produced according to these alternative examples showed that the drawing pattern was disturbed in the portion where the transitional portion and the drawing pattern (a gate bus line pattern in this embodiment) overlap each other, but the pattern was not substantially disturbed in other portions where the mask transitional portion and the drawing pattern do not overlap each other.

In order to illustrate the degree of overlap between the transitional portion and the drawn pattern, the distance between a gate bus line (gate line) and its closest transitional portion is shown in FIGS. 5A to 5D. Dot pitch:drawing pitch=1:1, 2:3 and 1:2 in FIGS. 5A to 5C, respectively, and dot pitch:drawing pitch=41:56 in FIG. 5D.

In FIGS. 5A to 5D, the vertical axis of the graph represents the distance (μm) between a gate line (gate bus line) and its closest transitional portion, and the horizontal axis thereof represents a relative coordinate (μm) of each gate line with the coordinate of the first gate line (gate bus line) being 0 μm. As described above, the distance between a gate bus line and its closest transitional portion is defined between the center line of the gate bus line extending along its longitudinal direction and the center line of the closest transitional portion extending along its longitudinal direction.

Figure 5A:
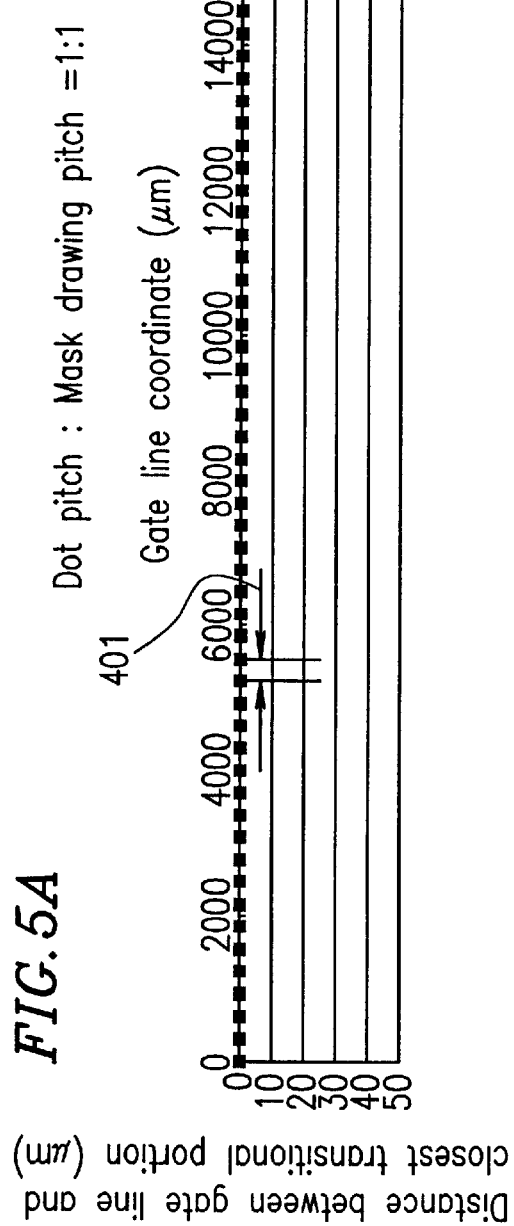
FIG. 5A illustrates a distance between a gate bus line and a transitional portion closest to the gate bus line when dot pitch:drawing pitch=1:1.
Figure 5B:
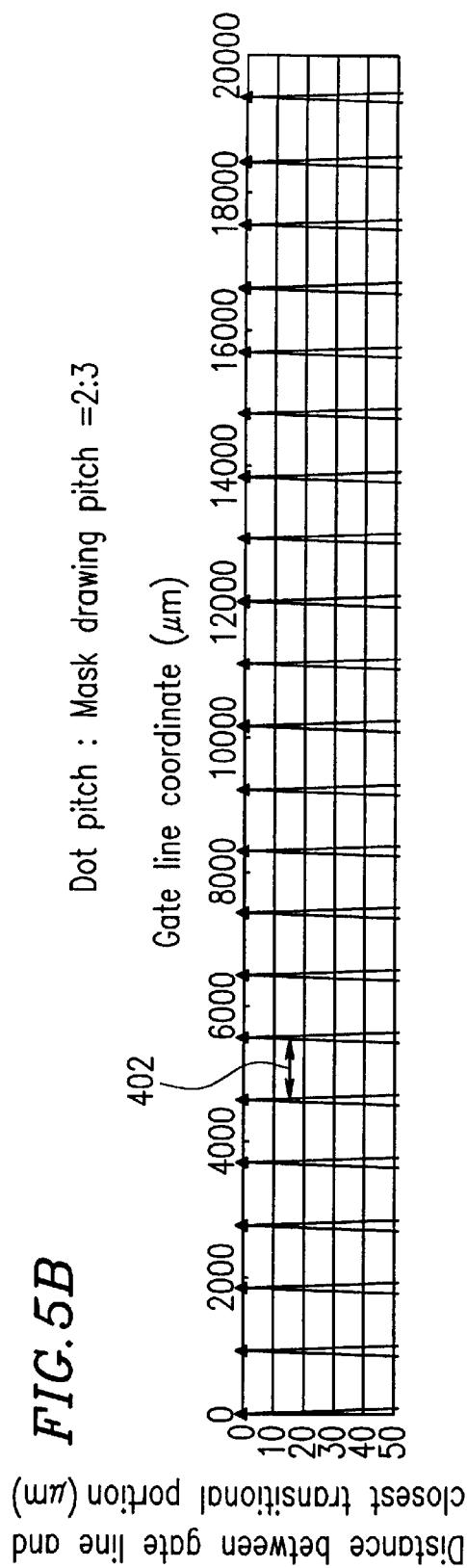
FIG. 5B illustrates a distance between a gate bus line and a transitional portion closest to the gate bus line when dot pitch:drawing pitch=2:3.
Figure 5C:
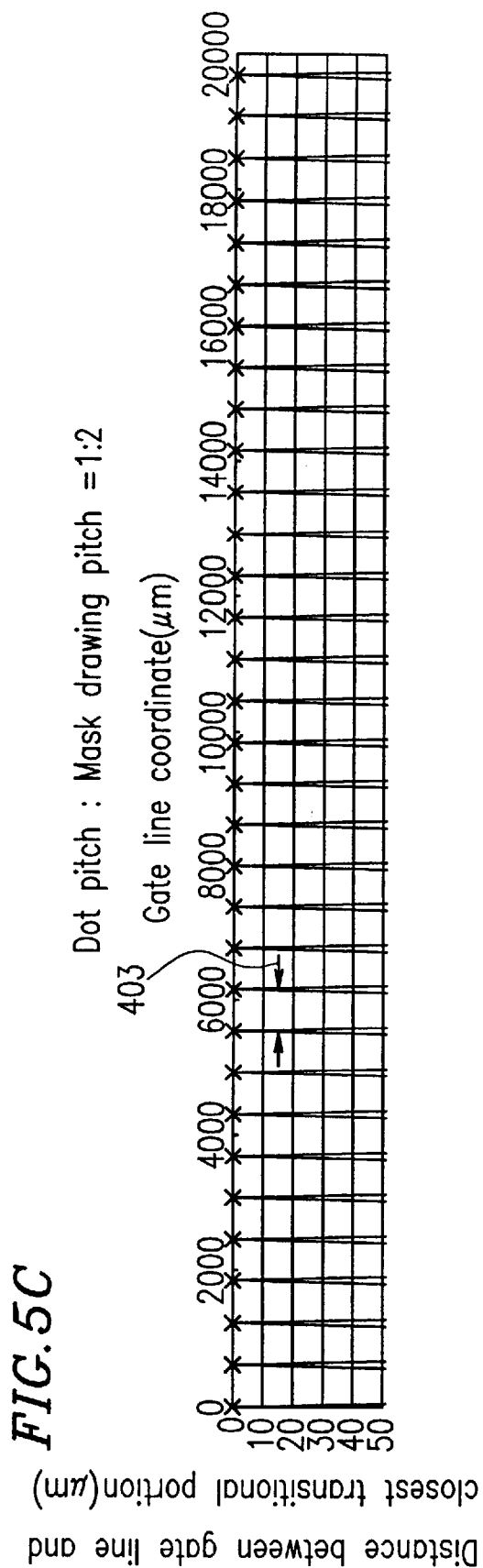
FIG. 5C illustrates a distance between a gate bus line and a transitional portion closest to the gate bus line when dot pitch:drawing pitch=1:2.

As can be seen from FIGS. 5A to 5C, when dot pitch-:drawing pitch=1:1, 2:3 and 1:2, the gate bus line pattern and the mask transitional portion completely overlap each other (i.e., the distance between the line pattern and the closest transitional portion is 0) for every line, every three lines, and every two lines, respectively, of the gate bus line pattern. In the examples illustrated in FIGS. 5A, 5B and 5C, a gate bus line pattern completely overlapping the closest transitional portion has a pitch of 307.5 μm (a pitch 401), 922.5 μm (a pitch 402) and 615 μm (a pitch 403), respectively. These pitches, being as short as 1 mm or less, are not observed by an observer as a brightness non-uniformity.

Figure 5D:
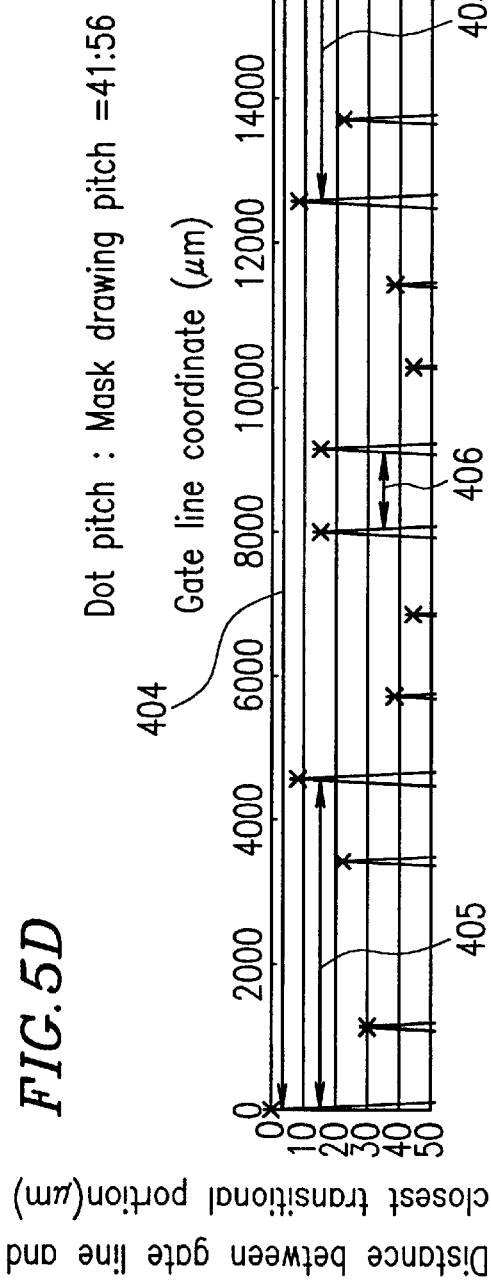
FIG. 5D illustrates a distance between a gate bus line and a transitional portion closest to the gate bus line when dot pitch:drawing pitch=41:56.

On the other hand, as can be seen from FIG. 5D, when dot pitch:drawing pitch=41:56, the gate bus line pattern and the mask transitional portion completely overlap each other for every 56 lines of the gate bus line pattern. A gate bus line pattern completely overlapping the closest transitional portion has a pitch of 17.22 mm (a pitch 404).

Moreover, when dot pitch:drawing pitch=41:56, there are some positions with the pitch 404 where the gate bus line pattern and the mask transitional portion partially (not completely) overlap each other because each of the gate bus line pattern and the mask transitional portion has a predetermined width. For example, a partial overlap between the gate bus line pattern and the mask transitional portion where the distance between the line pattern and the closest transitional portion is 7.5 μm appears with a pitch of about 6 mm. In such a case, three dark-colored lines are observed with the pitch 405 of 4.6 mm. Moreover, a partial overlap between the gate bus line pattern and the mask transitional portion where the distance between the line pattern and the closest transitional portion is 15 μm appears with a pitch of about 1.6 mm. In such a case, two light-colored lines are observed with the pitch 406 of about 1.6 mm. These dark-/light-colored lines as a whole can be observed as a non-uniformity having a total pitch of 17.22 mm.

Figure 2:
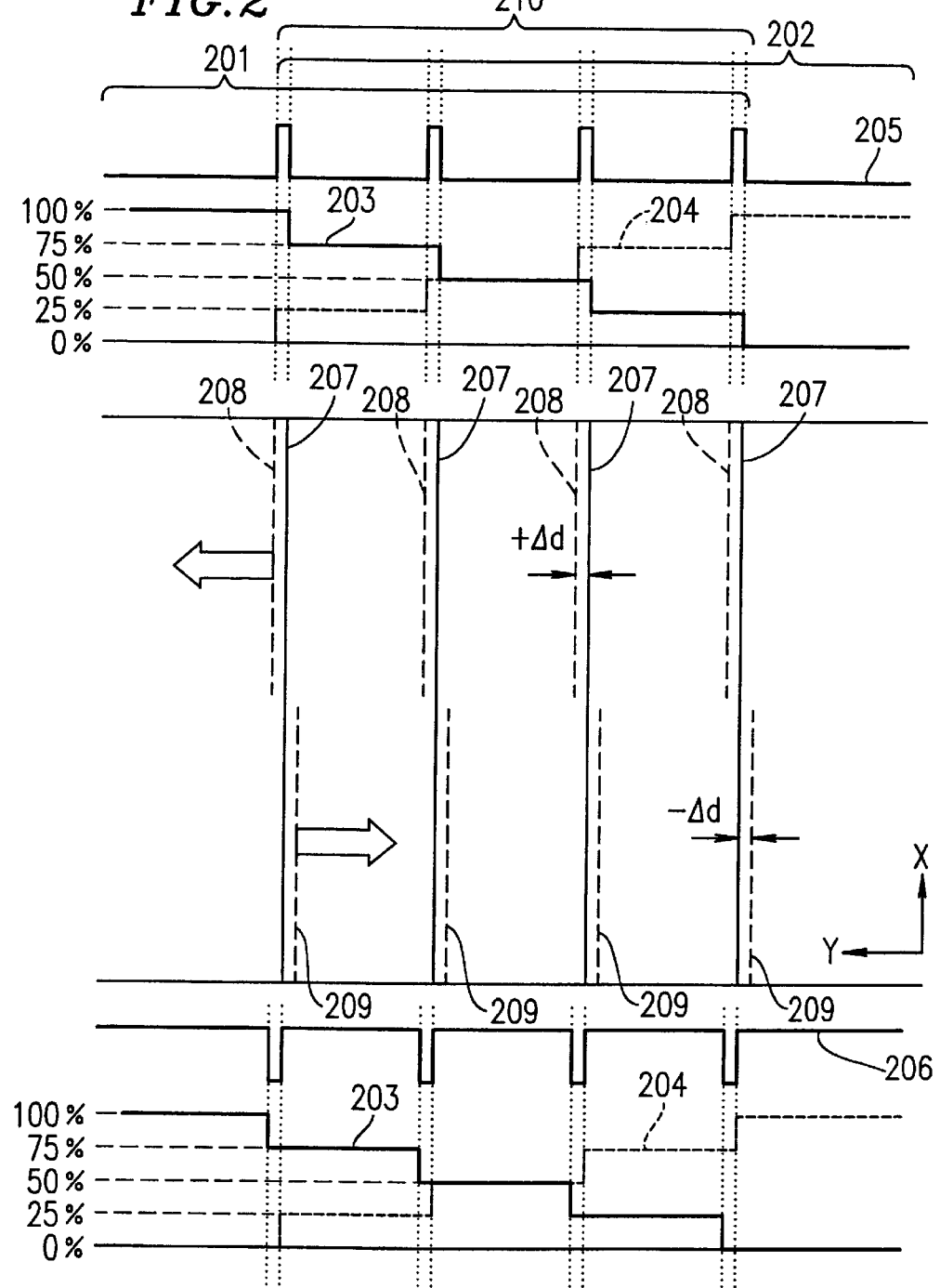
FIG. 2 illustrates a mask transitional portion as well as an exposure intensity profile in the mask transitional portion and a synthetic exposure intensity profile.

For example, when the gate bus line width 304 is about 21.5 μm, and the transitional portion width 306 is 33 μm, the minute positional shift in the exposed area as illustrated in the exposure intensity profile in a transitional portion of FIG. 2 causes a dimensional or positional shift in the pattern. As a result, when the distance between a gate line and the closest transitional portion is about 45 μm or less (i.e., the sum of ½ of the gate line width and the transitional portion width), the gate line and the transitional portion overlap each other, thereby disturbing the pattern, which is observed as a non-uniformity.

Moreover, it has been confirmed that the position where a non-uniformity occurs and the brightness of the non-uniformity have a strong correlation with a change in the line width dimension.

When the line width (gate bus line width) dimension was measured at a position where a significant non-uniformity was seen, there was observed a change in the line width dimension about 0.1 μm greater than those observed at other positions. Even at a position where the non-uniformity was slight, the dimensional change was about 0.03–0.07 μm greater than those observed at other positions. These results showed that a more significant non-uniformity is observed as the dimensional change is greater. It is believed that this phenomenon can be explained by Expression 2 which represents the intensity of diffracted light where the dot pitch is represented by a grating constant d, and the pattern line width is 2a (thus, a is equal to ½ of the pattern width) when the synchronous sequence pattern acts as a diffraction grating.

(Expression 2)

$$I = I_0 \left\{ \frac{\sin ka\{\sin(\alpha - \psi) + \sin(\beta - \psi)\}}{ka(\sin(\alpha - \psi) + \sin(\beta - \psi))} \right\}^2 \left[ \frac{\sin \frac{kNd}{2}\{\sin(\alpha - \psi) + \sin(\beta - \psi)\}}{\sin \frac{kd}{2}\{\sin(\alpha - \psi) + \sin(\beta - \psi)\}} \right]^2$$

In Expression 2, I is the intensity of diffracted light, $I_0$ is the intensity of incident light, 2a is the pattern line width, α is the incident angle, β is the scattering angle, ψ is the tapering angle, d is the dot pitch, N is the number of grids, and k is the proportional constant (an integer). The second term in the right-hand side of Expression 2 represents the contribution of the interference of the scattered light, and the third term represents the contribution of the diffraction to the entire grating. As can be seen from Expression 2, the tapering angle changes as the pattern line width 2a changes. The intensity of diffracted light changes according to these changes. This is believed to be the cause of the brightness non-uniformity.

When dot pitch:drawing pitch=1:1, the change in the light width of the gate bus line pattern and the change in the dot pitch were not substantially observed. When dot pitch:drawing pitch=2:3 and 1:2, a slight change was observed, but the non-uniformity pitch was 1 mm or less, whereby the non-uniformity could not be observed by a human observer.

These experiments and discussions show that the display non-uniformity on the display panel can be suppressed by setting the ratio of dot pitch:drawing pitch to a simple integral ratio and setting the non-uniformity pitch on the order of several dots (about 1 mm or less in total).

In the above description, a mask for use in the production of a gate bus line of an FPD substrate has been described. However, the mask of the present invention may alternatively be used as, for example, a source line, a semiconductor pattern, a pixel electrode pattern, an insulation pattern of a TFT substrate, or as a black matrix pattern, an RGB pixel pattern of a color filter. In such cases, the non-uniformity is similarly eliminated.

Figure 6:
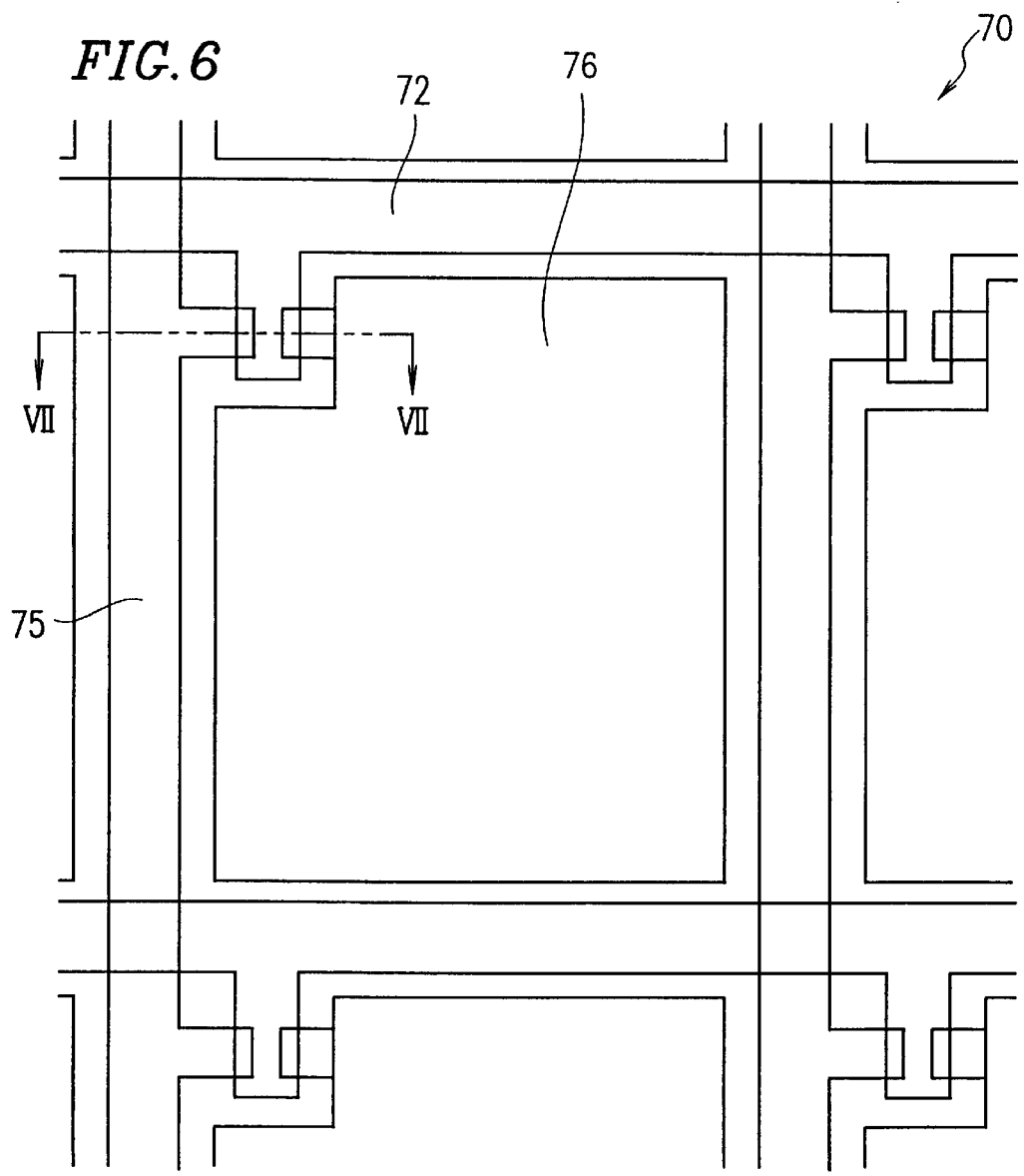
FIG. 6 illustrates a plan view of a thin transistor (TFT) substrate produced by using a photomask of the present invention.
Figure 7:
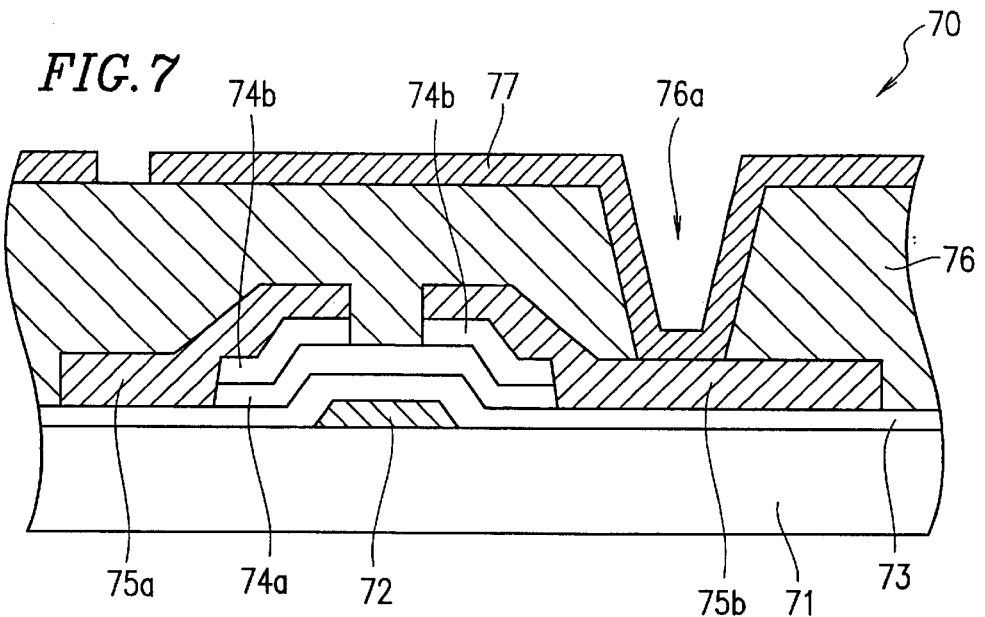
FIG. 7 illustrates a cross-sectional view of the TFT substrate illustrated in FIG. 6.

By using the above-described photomask of the present invention, a TFT substrate can be produced. FIG. 6 illustrates a plan view of a TFT substrate 70, and FIG. 7 illustrates a cross-sectional view of the TFT substrate 70 illustrated in FIG. 6 taken along line VII—VII. For example, a metal film of Ta, or the like, is deposited by, for example, a conventional sputtering method on a substrate 71 which is made of a glass, or the like. The deposited metal film is patterned by a conventional photolithography method by using the photomask of the present invention, thereby forming a gate bus line 72. A semiconductor layer 74 is formed over the gate bus line 72 via, for example, a gate insulating film 73. The semiconductor layer 74 includes an i-Si layer 74a and an n$^+$—Si layer 74b. Thereafter, another metal film of Ta, or the like, is formed by using, for example, a sputtering method, and then patterned by a photolithography method, thereby forming a source bus line 75a and a drain bus line 75b. Then, an interlayer insulating film 76 having a contact hole 76a is formed. Finally, a pixel electrode 77 is formed on the interlayer insulating film 76 by the same method as that used for forming the source/drain bus line 75. In the case of a transmission type display device, the pixel electrode may be a transparent electrode made of, for example, ITO (indium tin oxide). Each of the source bus line and the pixel electrode is connected to the semiconductor layer, and is patterned so as to be interrupted over the semiconductor layer. The photomask of the present invention is also used in this step. Thus, a TFT substrate is produced.

Figure 8:
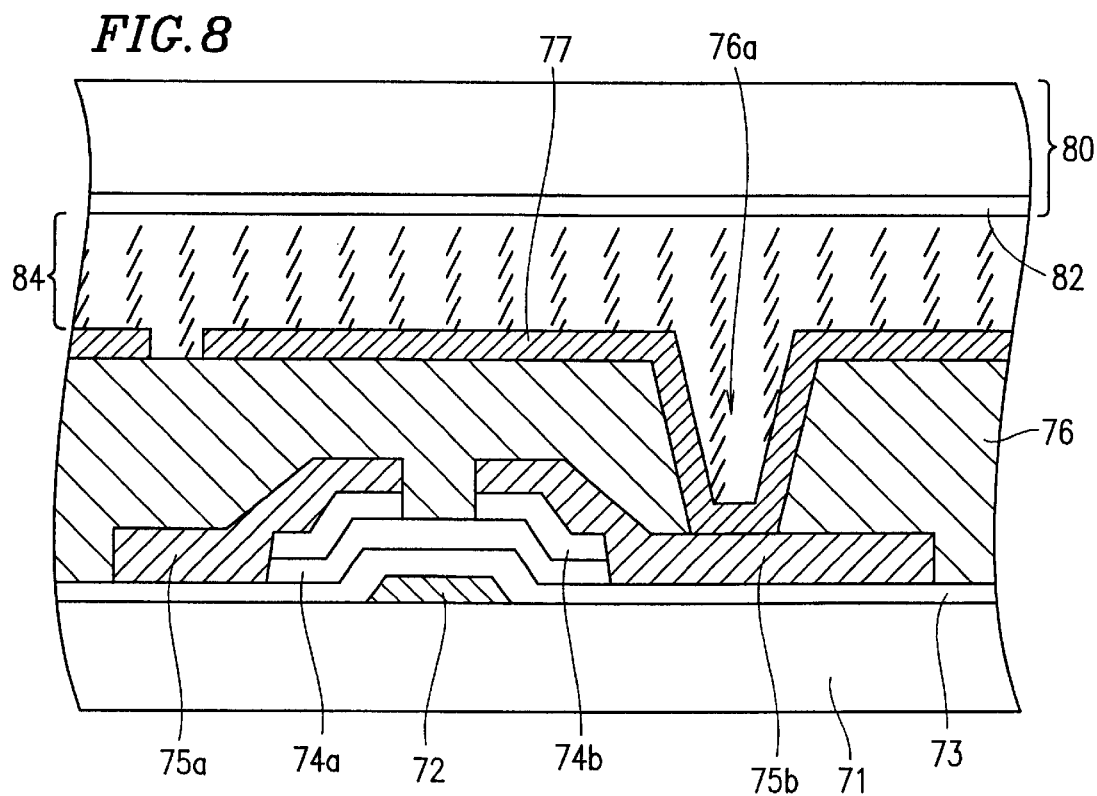
FIG. 8 illustrates a cross-sectional view of a display device produced by using the substrate illustrated in FIG. 6.

By using the TFT substrate (active matrix substrate) produced by using the photomask of the present invention, a display device can be produced. FIG. 8 illustrates a cross-sectional view of such a display device. For example, as described above, a TFT substrate can be produced by forming a TFT (including a gate bus line, a source bus line, a semiconductor layer, an interlayer insulating layer, and a pixel electrode) on a substrate by using the photomask of the present invention. Then, a counter substrate 80 (e.g., a glass substrate) facing the TFT substrate is provided, and a counter electrode 82 made of, for example, ITO is formed on one surface of the counter substrate which faces the TFT substrate. The two substrates are attached to each other using a spacer, or the like, therebetween so as to maintain a predetermined gap therebetween. A display medium layer 84 made of, for example, a liquid crystal material is provided in the gap. Thus, a display device is produced.

Figure 9:
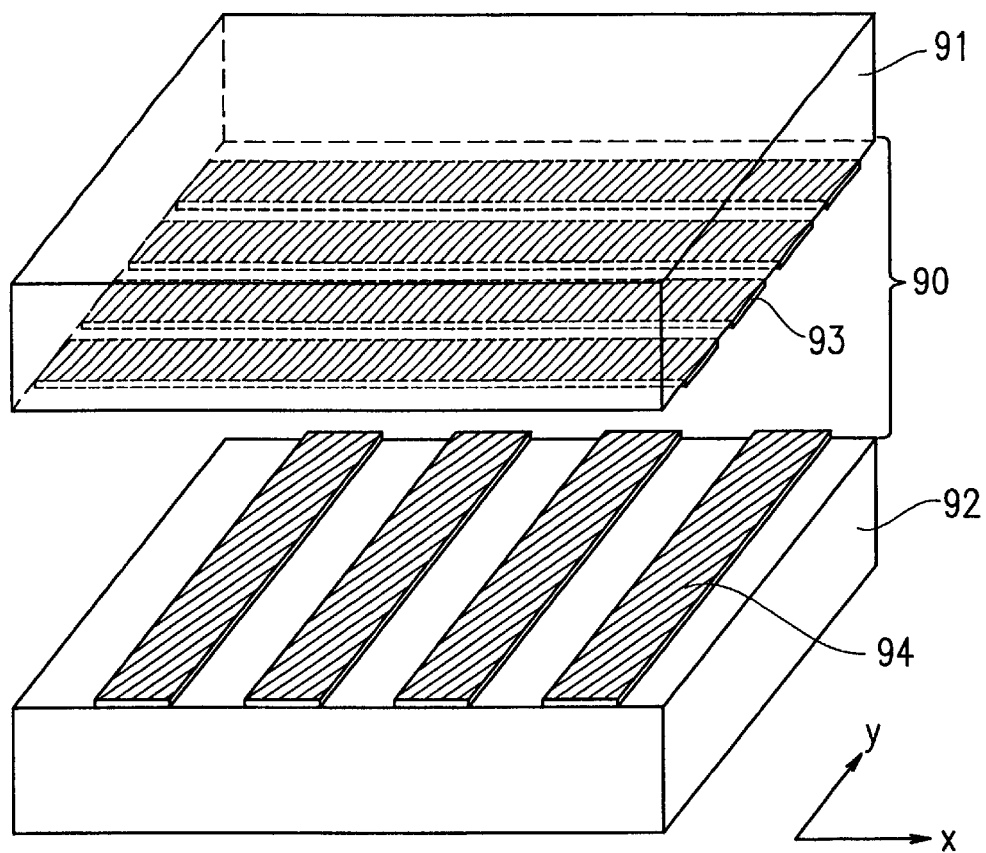
FIG. 9 is a schematic perspective view illustrating a structure of the main part of a liquid crystal display device which employs a duty driving method.

The photomask of the present invention may also be used in the production of a liquid crystal display device which employs a duty driving method. FIG. 9 is a schematic perspective view illustrating a structure of the main part of the liquid crystal display device which employs a duty driving method. This liquid crystal display device includes a substrate 91 (first substrate) and another substrate 92 (second substrate) which oppose each other with a display medium layer 90 made of a liquid crystal material being interposed therebetween. The substrates 91 and 92 maybe formed of, for example, a glass or a plastic. On one surface of the substrate 91 which faces the display medium layer 90, a plurality of first signal lines 93 are provided extending in a stripe pattern along the x direction. On one surface of the substrate 92 which faces the display medium layer 90, a plurality of second signal lines 94 are provided extending in a stripe pattern along the y direction. The first and second signal lines 93 and 94 may be formed of, for example, a transparent conductive film such as ITO. At least one of the first and second signal lines 93 and 94 is provided by a method similar to that described above by using the photomask of the present invention. The other components, not shown in FIG. 9, of the liquid crystal display device employing the duty driving method and the display operation of the liquid crystal display device are substantially the same as those well known in the art, and therefore will not be described herein.

A drawn pattern corresponding to any dot pitch of a liquid crystal display device (e.g., the dot pitch shown in Table 1) is provided as follows. For example, an objective lens and a polygon mirror sufficiently large for the mask drawing device are provided. Moreover, the following two mechanisms are further provided: (1) a mechanism for sending an appropriate beam scanning width from the drawing pattern instruction section to the AO modulation control mechanism in the optical head 104 of the mask drawing device; and (2) a mechanism for sending an appropriate stage moving pitch from the drawing pattern instruction section to the mechanism for controlling the operation of driving the optical stage 107. Thus, it is possible to draw a pattern with any scanning width within the maximum stage moving pitch.

By the above-described method, it is possible to set the ratio between the drawing pitch and the dot pitch of the pattern to a simple integral ratio so that the least common multiple thereof is 1 mm or less. Thus, the problem of the lightness/darkness non-uniformity being observed on the display panel is eliminated.

As described above, according to the present invention, it is possible to eliminate or reduce the non-uniformity on the mask by making the photomask pattern and the transitional portion meet each other with a short cycle. In the above-described embodiment of the present invention, for the purpose of discussion, a case where a pattern is drawn while fixing the scanning length and shifting the position of the pattern has been described. However, effects similar to those described above can alternatively be obtained by variably controlling the scanning length 6f the drawing head, or by variably controlling the drawing stage moving pitch so as to make the drawing pitch have a predetermined relationship with the pattern pitch. Such a photomask can be produced by using a mask drawer with an ordinary level of precision in the prior art, without using a high-performance mask drawer.

According to the present invention, there is provided a photomask in which even when a pattern non-uniformity occurs due to a difference between the pattern precision in a transitional portion (which is formed on the mask when drawing the mask by using a raster scan type pattern drawing device, or the like) and that in the other drawn areas, the pattern non-uniformity occurs with a cycle less than or equal to 1 mm. This photomask can be produced relatively quickly even when using a drawer whose precision is relatively low. When a patterned substrate provided by using such a photomask is used as, for example, a TFT substrate or a color filter substrate of a display device, no lightness/darkness non-uniformity or display non-uniformity is observed on the display panel. Therefore, with the photomask of the present invention, it is possible to improve the display quality of the display device. Thus, the present invention makes it possible to produce a high-quality display device on which no brightness non-uniformity is observed by using the inexpensive but high-quality photomask.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A photomask for use in production of a display device, the photomask having on its surface a plurality of drawn areas, and a plurality of transitional portions each defined by an area of overlap of two adjacent side by side ones of the drawn areas, wherein:
   a pattern including a plurality of spaced apart continuous pattern portions is formed on at least one of the drawn areas; and
   a ratio (x:y) between a pattern pitch of the pattern portions and a transitional portion pitch of the transitional portions is an integral ratio such that a length defined by a least common multiple (x or y) of the pattern pitch and the transitional portion pitch is 1 mm or less.

2. A photomask according to claim 1, wherein the ratio (x:y) between the pattern pitch and the transitional portion pitch is 1:1.

3. A photomask according to claim 1, wherein the ratio (x:y) between the pattern pitch and the transitional portion pitch is 3:4, 2:3, 1:2, 1:3 or 1:4.

4. A photomask according to claim 1, wherein the pattern and the transitional portions do no overlap each other.

5. A photomask according to claim 1, wherein the pattern pitch corresponds to a dot pitch of the display device.

6. A photomask according to claim 1, wherein the transitional portion pitch is determined by controlling a scanning width of a head of a mask drawer for drawing the drawn areas and a pitch with which a stage of the mask drawer is moved.

7. A photomask according to claim 1, wherein the pattern is a signal line.

8. A photomasks according to claim 1, wherein a pattern drawing operation is performed by a raster scan method.

9. A method for producing a TFT (thin film transistor) substrate, comprising the steps of:
   forming a gate bus line on a substrate;
   forming a semiconductor layer on the substrate;
   forming a source bus line so that the source bus line crosses the gate bus line and is electrically connected to the semiconductor layer; and
   forming a pixel electrode so that the pixel electrode is electrically connected to the semiconductor layer, wherein:
   at least one of the gate bus line, the source line, the semiconductor layer and the pixel electrode is formed using a photomask;
   wherein the photomask has on its surface a plurality of drawn areas and at least one transitional portion defined as an area of overlap of two adjacent side by side ones of the drawn areas; a pattern including a plurality of spaced apart continuous pattern portions is formed on at least one of the drawn areas; and a ratio x:y between a pattern pitch of the pattern portions and a transitional portion pitch of most closely adjacent transitional portions is an integral ratio such that a length defined by a least common multiple x or y of the pattern pitch and the transitional portion pitch is 1 mm or less.

10. A method for producing a display device, comprising the steps of:
    forming a thin film transistor (TFT) including a gate bus line, a source bus line, a semiconductor layer and a pixel electrode on a first substrate;
    forming a counter electrode on a surface of a counter substrate which faces the first substrate; and
    providing a display medium layer between the first substrate and the counter substrate, wherein:
    the step of forming the TFT comprises the step of forming at least one of the gate bus lines, the source bus line, the semiconductor layer and the pixel electrode using a photomask; and
    wherein the photomask has on its surface a plurality of drawn areas and at least one transitional portion defined as an area of overlap of two side by side ones of the drawn areas; a pattern including a plurality of spaced apart continuous pattern portions is formed on at least one of the drawn areas; and a ratio x:y between a pattern pitch of the pattern portions and a transitional portion pitch of most closely adjacent transitional portions is an integral ratio such that a length defined by a least common multiple x or y of the pattern pitch and the transitional portion pitch is 1 mm or less.

11. A method for producing a display device according to claim 10, wherein the display device further comprises a color filter, and the color filter is formed by using the photomask.

12. A method for producing a display device, comprising the steps of:

forming, on a first substrate, a plurality of first signal lines extending in a stripe pattern along a first direction;

forming, on a second substrate which opposes the first substrate, a plurality of second signal lines extending in a stripe pattern along a direction different from the first direction; and providing a display medium layer between the first substrate and the second substrate, wherein:

using a photomask in at least one of the step of forming the first signal lines and the step of forming the second signal lines; and wherein the photomask has on its surface a plurality of drawn areas and at least one transitional portion which is an area of overlap of two side by side drawn areas; a pattern including a plurality of spaced apart continuous pattern portions is formed on at least one of the drawn areas; and a ratio x:y between a pattern pitch of the pattern portions and a transitional portion pitch of most closely adjacent transitional portions is an integral ratio such that a length defined by a least common multiple x or y of the pattern pitch and the transitional portion pitch is 1 mm or less.

* * * * *